(12) United States Patent
Lu et al.

(10) Patent No.: US 8,878,249 B2
(45) Date of Patent: Nov. 4, 2014

(54) METHOD FOR HETEROEPITAXIAL GROWTH OF HIGH CHANNEL CONDUCTIVITY AND HIGH BREAKDOWN VOLTAGE NITROGEN POLAR HIGH ELECTRON MOBILITY TRANSISTORS

(71) Applicant: The Regents of the University of California, Oakland, CA (US)

(72) Inventors: Jing Lu, Goleta, CA (US); Stacia Keller, Santa Barbara, CA (US); Umesh K. Mishra, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/861,808

(22) Filed: Apr. 12, 2013

(65) Prior Publication Data

US 2013/0307027 A1 Nov. 21, 2013

Related U.S. Application Data

(60) Provisional application No. 61/623,182, filed on Apr. 12, 2012.

(51) Int. Cl.
*H01L 29/66* (2006.01)
*H01L 21/338* (2006.01)

(52) U.S. Cl.
USPC ........................................... 257/194; 438/172

(58) Field of Classification Search
CPC ...................................................... H01L 29/778
USPC ............................................ 257/194; 438/172
See application file for complete search history.

(56) References Cited

U.S. PATENT DOCUMENTS

| | | | |
|---|---|---|---|
| 7,465,967 B2 | 12/2008 | Smith et al. | |
| 7,566,580 B2 | 7/2009 | Keller et al. | |
| 7,728,355 B2 | 6/2010 | Beach et al. | |
| 7,851,825 B2 | 12/2010 | Suh et al. | |
| 7,935,985 B2 | 5/2011 | Mishra et al. | |
| 7,948,011 B2 | 5/2011 | Rajan et al. | |
| 8,039,352 B2 | 10/2011 | Mishra et al. | |
| 2005/0173728 A1 | 8/2005 | Saxler | |
| 2008/0054303 A1 | 3/2008 | Beach | |
| 2009/0072272 A1 | 3/2009 | Suh et al. | |
| 2009/0212324 A1 | 8/2009 | Tamai et al. | |
| 2009/0246944 A1 | 10/2009 | Keller et al. | |
| 2011/0210378 A1 | 9/2011 | Ueno et al. | |
| 2013/0307027 A1* | 11/2013 | Lu et al. | 257/194 |

OTHER PUBLICATIONS

PCT International Search Report and Written Opinion dated Aug. 8, 2013 for PCT Application No. PCT/US13/36342.
Kuzmik, J., "Power Electronics on InAlN/(In)GaN: Prospect for a Record Performance," IEEE Electron Device Letters, 2001, pp. 510-512, vol. 22, No. 11.

(Continued)

*Primary Examiner* — Mark Prenty
(74) *Attorney, Agent, or Firm* — Gates & Cooper LLP

(57) ABSTRACT

A method for growing high mobility, high charge Nitrogen polar (N-polar) or Nitrogen face (In,Al,Ga)N/GaN High Electron Mobility Transistors (HEMTs). The method can provide a successful approach to increase the breakdown voltage and reduce the gate leakage of the N-polar HEMTs, which has great potential to improve the N-polar or N-face HEMTs' high frequency and high power performance.

21 Claims, 13 Drawing Sheets

(56) References Cited

OTHER PUBLICATIONS

Keller, S., et al., "Influence of the substrate misorientation on the properties of N-polar InGaN/GaN and AlGaN/GaN heterostructures," Journal of Applied Physics, 2008, 093510, pp. 093510-1 to 093510-6, vol. 104.

Wong, M.H., et al., "Low nonalloyed Ohmic contact resistance to nitride high electron mobility transistors using N-face growth," Applied Physics Letters, 2007, 232103, pp. 232103-1 to 232103-3, vol. 91.

Rajan, S., "Advanced Polarization Engineering for GaN-based Transistors," Thesis, University of California, Santa Barbara, Dec. 2006.

Brown, D., et al., "Growth and characterization of In-polar and N-polar InAlN by metal organic chemical vapor deposition," Journal of Applied Physics, 2010, 033509, pp. 033509-1 to 033509-7, vol. 107.

Kolluri, S., et al., "RF Performance of N-Polar AlGaN/GaN MIS-HEMTs Grown by MOCVD on Sapphire Substrate," IEEE Electron Device Letters, Jun. 2009, pp. 584-586, Vol. 30, No. 6.

Lu, J., et al., "Very-high channel conductivity in N-face (InAlN,AlGaN)IGaN high electron mobility hetero-junctions grown by metalorganic chemical vapor deposition", Abstract of presentation presented at the Electronic Materials Conference (EMC), Jun. 20, 2012.

Lu, J., et al., "Influence of a thin InAlN cap layer on the device performance of N-polar InAlN/GaN MIS-HEMTs grown By MOCVD", Abstract of presentation presented at the International Symposium on Compound Semiconductors (ISCS), Aug. 27, 2012.

Lu, J., et al., "Ultra Thin Channel N-polar (InAlN, AlGaN)/GaN HEMTs Grown by Metal Organic Chemical Vapor Deposition", Abstract of presentation given at the International Workshop on Nitride Semiconductors (IWN), Oct. 18, 2012.

Lu, J., et al., "Very high channel conductivity in ultra-thin channel N-polar GaN/(AlN, InAlN, AlGaN) high electron mobility hetero-junctions grown by metalorganic chemical vapor deposition", Applied Physics Letters, 2013, 232104, pp. 232104-1-232104-5, vol. 102.

Lu, J., et al., "Engineering the (IN, Al, Ga)N back-barrier to achieve high channel-conductivity for extremely scaled channel-thicknesses in N-polar GaN high-electron-mobility-transistors", Applied Physics Letters, 2014, 092107, pp. 092107-1-092107-4, vol. 104.

Lu, J., "Design and Epitaxial Growth of Ultra-scaled N-polar GaN/(In, Al, Ga) N HEMTs by Metal Organic Chemical Deposition and Device Characterization", Thesis, University of California, Santa Barbara, Dec. 2013.

* cited by examiner

| 114 | SiNx cap |
|---|---|
| 112 | InAlN cap |
| 110 | GaN channel |
| 108 | AlN interlayer |
| 106a | InAlN |
| 104 | n++ GaN doping layer |
| 102 | SI GaN Template |
| 100 | 4A miscut sapphire |

(a)

| 114 | SiNx cap |
|---|---|
| 112 | InAlN cap |
| 110 | GaN channel |
| 108 | AlN interlayer |
| 106b(2) | InAlN |
| 106b(1) | AlGaN |
| 104 | n++ GaN doping layer |
| 102 | SI GaN Template |
| 100 | 4A miscut sapphire |

| 114 | 5 nm SiNx |
|---|---|
| 110 | 15 nm GaN channel |
| 108 | 0.7 nm AlN |
| 106b(2) | X nm InAlN (x=0, 7.5, 15) |
| 106b(1) | 10 nm AlGaN (35%) |
| 104 | 20 nm AlGaN grading (0->35%) |
| 102 | SI GaN Template |
| 100 | 4A miscut sapphire |

(a)

| 114 | 5 nm SiNx |
|---|---|
| 110 | 10 nm GaN channel |
| 108 | 0.7 nm AlN |
| 106b(1) | X nm AlGaN (35%) (X=0, 5, 10) |
| 106b(2) | 10 nm InAlN |
| 104 | 7.5 nm n++ GaN Si: 1.5E19 |
| 102 | SI GaN Template |
| 100 | 4A miscut sapphire |

| 5 nm SiNx | 114 |
|---|---|
| 110 X (15, 20 nm) GaN channel | |
| 108 0.7nm AlN | |
| 106a 25nm InAlN | |
| 104 7.5nm n++ GaN Si: 1.5E19 | |
| 102 SI GaN Template | |
| 100 Miscut Sapphire | |

(a)

| 3 nm SiNx | 114 |
|---|---|
| 2 nm InAlN cap | 112 |
| X (15, 20 nm) GaN channel | 110 |
| 108 0.7nm AlN | |
| 106a 25nm InAlN | |
| 104 7.5nm n++ GaN Si: 1.5E19 | |
| 102 SI GaN Template | |
| 100 Miscut Sapphire | |

METHOD FOR HETEROEPITAXIAL GROWTH OF HIGH CHANNEL CONDUCTIVITY AND HIGH BREAKDOWN VOLTAGE NITROGEN POLAR HIGH ELECTRON MOBILITY TRANSISTORS

CROSS-REFERENCE TO RELATED APPLICATIONS

This application claims the benefit under 35 U.S.C. Section 119(e) of commonly assigned U.S. Provisional Patent Application Ser. No. 61/623,182, filed on Apr. 12, 2012 by Jing Lu, Stacia Keller, and Umesh Mishra, entitled "METHOD FOR HETEROEPITAXIAL GROWTH OF HIGH CHANNEL CONDUCTIVITY AND HIGH BREAKDOWN VOLTAGE NITROGEN POLAR HIGH ELECTRON MOBILITY TRANSISTORS";

which application is incorporated by reference herein.

STATEMENT REGARDING FEDERALLY SPONSORED RESEARCH AND DEVELOPMENT

This invention was made with Government support under Grant No. N00014-08-1-0655 awarded by the Office of Naval Research (ONR) under the DRIFT program. The Government has certain rights in this invention.

BACKGROUND OF THE INVENTION

1. Field of the Invention

This invention relates to high channel conductivity Nitrogen polar (N-polar) High Electron Mobility Transistors (HEMTs) with (In,Al,Ga)N combination backbarriers, and a method of fabrication thereof.

2. Description of the Related Art

The terms "(In,Al,Ga,B)N," or "Group III nitride," or "III-nitride," or "nitride," as used herein are equivalent and refer to any alloy composition of semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$. For example, (In,Al,Ga)N could include any alloy composition of semiconductors having the formula $In_xAl_yGa_zN$ where $0 \leq x \leq 1$, $0 \leq y \leq 1$, $0 \leq z \leq 1$, and $x+y+z=1$. Moreover, the use of these terms is intended to be broadly construed to include respective nitrides of the single species, B, In, Al and Ga, as well as binary, ternary and quaternary compositions of such Group III metal species, including, but not limited to, the compositions of AlN, GaN, AlGaN and InAlN. Further, materials within the scope of the invention may further include quantities of dopants, or other impurities, or other inclusional materials, typically in concentrations which are substantially lower than the concentrations of the Group III compounds.

The terms "Nitrogen polar" or "N-polar," or equivalently "Nitrogen face" or "N-face," describe the crystallographic nature of the surface of the (Al,Ga,In,B)N structures. Similarly, the terms "Gallium polar," "Ga-polar," or "III-polar," or equivalently "Gallium face," "Ga-face," or "III-face," also describe the crystallographic nature of the surface of the (Al,Ga,In)N structures.

N-polar describes devices wherein the epitaxial layers are epitaxially grown in a [0 0 0 -1] direction of the wurtzite crystal, or on a [0 0 0 -1] surface of a III-nitride layer, where [0 0 0 -1] is an orientation in [h i k l] Miller index notation, and where the top or final grown surface of each layer comprises Nitrogen atoms or a [0 0 0 -1] surface. In N-face devices, the electrodes (e.g., the source, gate, and drain electrodes in the case of transistor devices) are typically formed on a nitrogen face or [0 0 0 -1] face of the underlying III-N material.

The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the bulk crystal will have reduced polarization along the growth direction.

These devices are typically grown epitaxially using growth techniques, such as Metal Organic Chemical Vapor Deposition (MOCVD), molecular beam epitaxy (MBE), hydride vapor phase epitaxy (HVPE), chemical beam epitaxy (CBE), etc.

III-Nitride devices such as III-N transistors are typically III-polar devices, such that the electrodes of the device are formed on a Group III face or [0 0 0 1] face of the underlying III-N material. N-polar devices have shown promise in allowing for devices with very low contact resistances. However, further improvements in N-polar devices are needed in order to allow for their widespread adoption.

SUMMARY OF THE INVENTION

One or more embodiments of the present invention disclose a method for fabricating an electronic device, comprising forming a Nitrogen polar III-Nitride channel layer on a Nitrogen polar $In_xAl_yGa_zN$ barrier layer, wherein a compositional difference between the barrier layer and the channel layer results in a two-dimensional electron gas (2DEG) being induced in the channel layer; and forming an electrode over the channel layer, wherein an N-face of the channel layer is adjacent to the electrode and a Group III face of the channel layer is opposite the N-face; wherein an indium composition x of the barrier layer is between 0.15 and 0.2.

The method can further comprise forming the Nitrogen polar $In_xAl_yGa_zN$ barrier layer on or above a substrate or a template on the substrate.

A composition, thickness, and structure of the barrier layer can be such that for a channel thickness of no more than 5 nanometers (nm), the a sheet resistance of the 2DEG is less than 300Ω per square and an electron mobility of the 2DEG is no less than 1100 $cm^2/Vs$.

The barrier layer can be substantially lattice matched to GaN or to the III-nitride substrate or template.

The barrier layer can be doped.

The $In_xAl_yGa_zN$ barrier layer can be part of a backbarrier, the backbarrier further comprising an AlGaN barrier layer. The AlGaN barrier layer can be between the $In_xAl_yGa_zN$ barrier layer and the template or substrate. The $In_xAl_yGa_zN$ barrier layer can be between the AlGaN barrier layer and the template or substrate.

The method can further comprise depositing an InAlN cap layer above the channel layer such that the channel layer is between the InAlN cap layer and the barrier layer.

The electrode can be a gate, and the device can further comprise a source and drain on opposite sides of the gate, wherein a composition and thickness of the InAlN cap layer is such that a breakdown voltage of the device is no less than 125 Volts per 1 micrometer of gate to drain distance $L_{gd}$.

The barrier layer and the channel layer can be grown using metal organic chemical vapor deposition (MOCVD).

One or more embodiments of the inventions disclose an electronic device (e.g., HEMT) fabricated according to the method. A composition and thickness of the InAlN cap and the barrier layer is such that the HEMT has an output power density of at least 3.34 W/mm with an associated power added efficiency (PAE) of at least 39% at a drain bias of 18 V and at an operation frequency of 4 GHz.

Accordingly, one or more embodiments of the present invention provide a process for using (e.g., MOCVD) to grow high mobility and high charge Nitrogen polar (N-polar) (In, Al, Ga)N/GaN HEMTs and also provides a successful approach to increase the breakdown voltage and reduce the gate leakage of N-polar HEMTs, which has great potential to improve N-polar HEMTs' high frequency and high power performance.

BRIEF DESCRIPTION OF THE DRAWINGS

Referring now to the drawings in which like reference numbers represent corresponding parts throughout:

FIGS. 1(a) and 1(b) are cross-sectional schematics of epitaxial structures illustrating: in FIG. 1(a), an N-polar InAlN HEMT with an InAlN cap layer; and, in FIG. 1(b), an N-polar HEMT with InAlN and AlGaN combination barriers with an InAlN cap layer.

FIGS. 2(a) and 2(b) are cross-sectional schematics of epitaxial structures illustrating: in FIG. 2(a), an N-polar AlGaN/InAlN/AlN HEMT; and, in FIG. 2(b), an N-polar InAlN/AlGaN/AlN HEMT.

in FIG. 4(c), electron concentration $n_s$; in FIG. 4(b), directional dependent mobility; and, in FIG. 4(a), sheet resistance values, measured in ohms per square ohm/sqr; calculated from van der Pauw Hall and TLM measurements of N-polar AlGaN HEMTs having the structure of FIG. 2(a), for different thicknesses of the InAlN insertion layers, wherein for TLM perpendicular, the TLM pattern is oriented perpendicular to the multi-atomic steps on the surface and for TLM parallel, the TLM pattern is oriented parallel to the multi-atomic steps on the surface.

in FIG. 5(c), electron concentration; in FIG. 5(b), Hall mobility for directional mobilities parallel and perpendicular to miscut direction; and, in FIG. 5(a), sheet resistance values; derived from van der Pauw Hall and TLM measurements of N-polar InAlN HEMTs having the structure of FIG. 2(b), for different thicknesses of the AlGaN insertion layers.

in FIG. 6(c), electron concentration; in FIG. 6(b), mobility; and, in FIG. 6(a), sheet resistance $R_{sh}$; versus channel thickness of N-polar AlGaN/InAlN/AlN HEMTs having the structure of FIG. 2(a), where the InAlN insertion layer is 7.5 nm thick.

FIGS. 7(a) and 7(b) are cross-sectional schematics of epitaxial structures illustrating: in FIG. 7(a), a 5 nm $SiN_x$ cap; and, in FIG. 7(b), a 2 nm InAlN cap layer and 3 nm $SiN_x$.

FIGS. 10(a) and 10(b) are graphs comparing breakdown voltage corresponding to a three-terminal leakage current of 1 mA per millimeter of gate width, wherein FIG. 10(a) is gate to drain distance $L_{gd}$=2 μm and FIG. 10(b) is $L_{gd}$=5 μm ($t_{ch}$=15 nm), for devices having the structures in FIGS. 7(a) and 7(b), plotting drain source current density $I_{DS}$ in milliamps (mA) per millimeter (mm) of gate width as a function of gate-drain voltage $V_{GD}$.

DETAILED DESCRIPTION OF THE INVENTION

Figure 3:
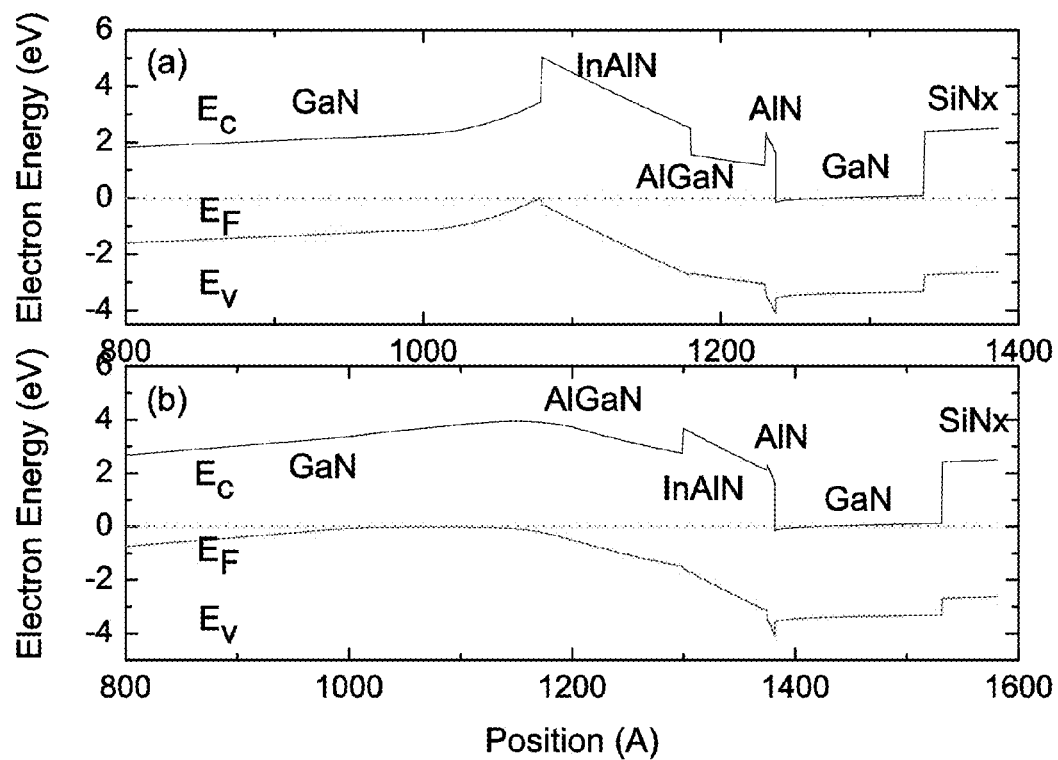
FIG. 3(a) is a band diagram of an N-polar InAlN/AlGaN/AlN HEMT.
FIG. 3(b) is a band diagram of an N-polar AlGaN/InAlN/AlN HEMT, plotting electron energy in electron volts (eV) as a function of position, in Angstroms Å, in the epitaxial structure.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION

The present invention provides an approach using MOCVD to grow high mobility, high charge, N-polar InAlN HEMTs with high breakdown voltage and low gate leakage, which has great potential to improve HEMTs' high frequency and high power performance.

Compared to Ga-polar HEMTs, N-polar devices have several advantages, such as lower contact resistance and better electron confinement because of the natural backbarrier. The $In_xAl_{1-x}N$ material system, as an alternate barrier layer, has great potential for high power and high frequency group-III nitride electronic device applications. In contrast to AlGaN, $In_xAl_{1-x}N$ can be grown lattice-matched to GaN at an In composition of about 17.5% with high spontaneous polarization charge at the InAlN/GaN interface.

FIGS. 1(a) and 1(b) are schematics illustrating the general epitaxial structures of the N-polar HEMTs introduced in this disclosure. The III-N layers each have an N-face that is opposite the substrate. Although not shown in FIG. 1, source, gate, and drain contacts are formed to complete the fabrication of the HEMT. The inventors have studied the N-polar HEMTs with InAlN backbarriers, as shown in FIG. 1(a), as well as N-polar HEMTs with InAlN and AlGaN combination backbarriers, as shown in FIG. 1(b).

Note that, in FIG. 1(b), the order of InAlN layer 106b(2) and AlGaN layer 106b(1) can be interchanged. From the bottom to top, the epitaxial structures include the following layers: (a) a miscut sapphire substrate 100 with angle of 4° toward the a-plane; (b) a GaN semi-insulating (SI) template 102, including Fe-doped GaN nucleation layer and Fe-doped GaN buffer; (c) a thin (~10 nm thick) n++ Si-doped GaN delta doping back layer 104; (d) an unintentional doped (UID) InAlN backbarrier 106a with an Indium composition of 17.5%, or InAlN and AlGaN combination backbarriers 106b (1) and 106b(2); (e) a very thin (~1 nm thick) MN interlayer 108; (f) a GaN channel layer 110; (g) an InAlN cap layer 112; and (h) an $SiN_x$ dielectric cap layer 114. Although not shown in FIG. 1, a two-dimensional electron gas (2DEG) conductive channel is induced in the GaN channel layer 110 due to a compositional difference between channel layer 110 and the underlying InAlN backbarrier layer 106a or 106b(2).

All the epitaxial structures were grown by MOCVD using trimethylgallium, trimethylaluminum, trimethylindium and ammonia as precursors on [0001] sapphire with a misorientation angle of 4° toward the a-sapphire-plane.

The present invention includes the following possible variations and modifications:
  The composition of the InAlN part of the (Al,Ga,In)N backbarrier can be other then 17.5%.
  The InAlN part of the (A,Ga,In)N backbarrier can be replaced by an InGaAlN layer.
  The AlGaN part of the (Al,Ga,In)N backbarrier can be replaced by an InGaAlN layer.
  The composition in the AlGaN and InAlN layers can be non-constant such as graded, for example.
  Both, the AlGaN and the InAlN part of the (Al,Ga,In)N backbarrier can be undoped or unintentionally doped (UID), or doped with desired dopants, such as silicon or magnesium, for example.
  All AlGaN, InAlN and InGaAlN layers can be designed as superlattices, comprised of thin $(Al_aGa_bN/Al_cGa_dN)$ and $(In_cAl_fN/In_gAl_hN)$ layers, for example, where a,b,c,d indicate composition.
  The InAlN cap thickness as well as the $SiN_x$ dielectric thickness can be varied depending on the requirements for individual devices.
  The cap material can be any combination of (In,Al,Ga)N and can be undoped or doped with desired dopants.
  A further thin GaN layer can be added on top of the InAlN cap layer.
  The GaN channel thickness is determined by the individual device application.
  Any appropriate substrate can be used, such as SiC, Si, free standing GaN, etc., with any misorientation angle, including no misoriention, and any suitable orientation.
  Any appropriate dielectric layer can be used in place of $SiN_x$ cap layer 114, such as $Al_2O_3$, $HfO_2$ (Hathium Oxide) or any other high k dielectric layer.
  The dielectric layer on top can also be achieved by InAlN oxidation using $O_2$ plasma treatment or $O_2$ annealing.
  Currently, the growth method being used is MOCVD; however, other growth methods, such as, for example, molecular beam epitaxy (MBE), hydride vapor phase epitaxy (HVPE), or chemical beam epitaxy (CBE), can be utilized as well.

The HEMTs were fabricated using standard photolithography. The ohmic metallization for the source and drain contacts was realized by a Ti/Al/Ni/Au (20/100/10/50 nm) multilayered stack, annealed at 820° C. for 30 seconds (s) in an $N_2$ atmosphere. Gates were fabricated using electron beam (e-beam) evaporation with a stack of Ni/Au/Ni (30/350/50 nm). The surface was subsequently passivated with a 2 nm thick $Al_2O_3$ layer, deposited by atom layer deposition, and a 130 nm thick $SiN_x$ layer, deposited by plasma-enhanced chemical vapor deposition (PECVD). Other fabrication methods, such as trench gate, deep recess gate, etc., can also be applied, depending on individual device applications.

One advantage and improvement of the present invention is the high channel conductivity of N-polar HEMTs with InAlN and AlGaN combination backbarriers.

The roughness of the AlGaN material system can be smaller than that of the InAlN material system, because the growth temperature for AlGaN is usually much higher (~1100° C.) than the growth temperature of InAlN (~800° C.). On the other hand, the InAlN material has much higher spontaneous polarization charge at the InAlN/GaN heterojunction. Using InAlN and AlGaN combination backbarriers can combine the advantages of both of these material systems.

FIGS. 2(a) and 2(b) illustrate two epitaxial structures for N-polar HEMTs with InAlN and AlGaN combination backbarriers, wherein FIG. 2(a) illustrates an N-polar AlGaN/InAlN/AlN HEMT and FIG. 2(b) illustrates an N-polar InAlN/AlGaN/AlN HEMT.

In FIG. 2(a), from bottom to top, the epitaxial structure comprises: a sapphire substrate 100, a SI GaN template 102, a 20 nm thick graded AlGaN layer 104, graded from 0 to 35% Al composition, a 10 nm thick $Al_{0.35}Ga_{0.65}N$ backbarrier layer 106b(1), an InAlN backbarrier layer 106b(2) having a thickness x of 0, 7.5 nm, or 15 nanometers and an In composition of 17.5%, a 0.7 nanometer thick AlN layer 108, a 15 nm thick GaN channel layer 110, and a 5 nanometer thick SiNx layer 114.

In FIG. 2(b), from bottom to top, the epitaxial structure comprises: a sapphire substrate 100, a SI GaN template 102, a 7.5 nm thick Silicon doped n++ GaN layer 104, doped with a dopant concentration of $1.5 \times 10^{19}$ $cm^{-3}$, a 10 nm thick InAlN backbarrier layer 106b(2) with In composition of 17.5%, an $Al_{0.35}Ga_{0.65}N$ backbarrier layer 106b(1) having a thickness x of 0, 7.5 nm, or 15 nanometers, a 0.7 nanometer thick AlN layer 108, a 10 nm thick GaN channel layer 110, and a 5 nanometer thick SiNx layer 114.

FIG. 3 shows the band diagrams for these devices, wherein FIG. 3(a) is a band diagram of an N-polar InAlN/AlGaN/AlN HEMT, and FIG. 3(b) is a band diagram of an N-polar AlGaN/InAlN/AlN HEMT.

Figure 4:
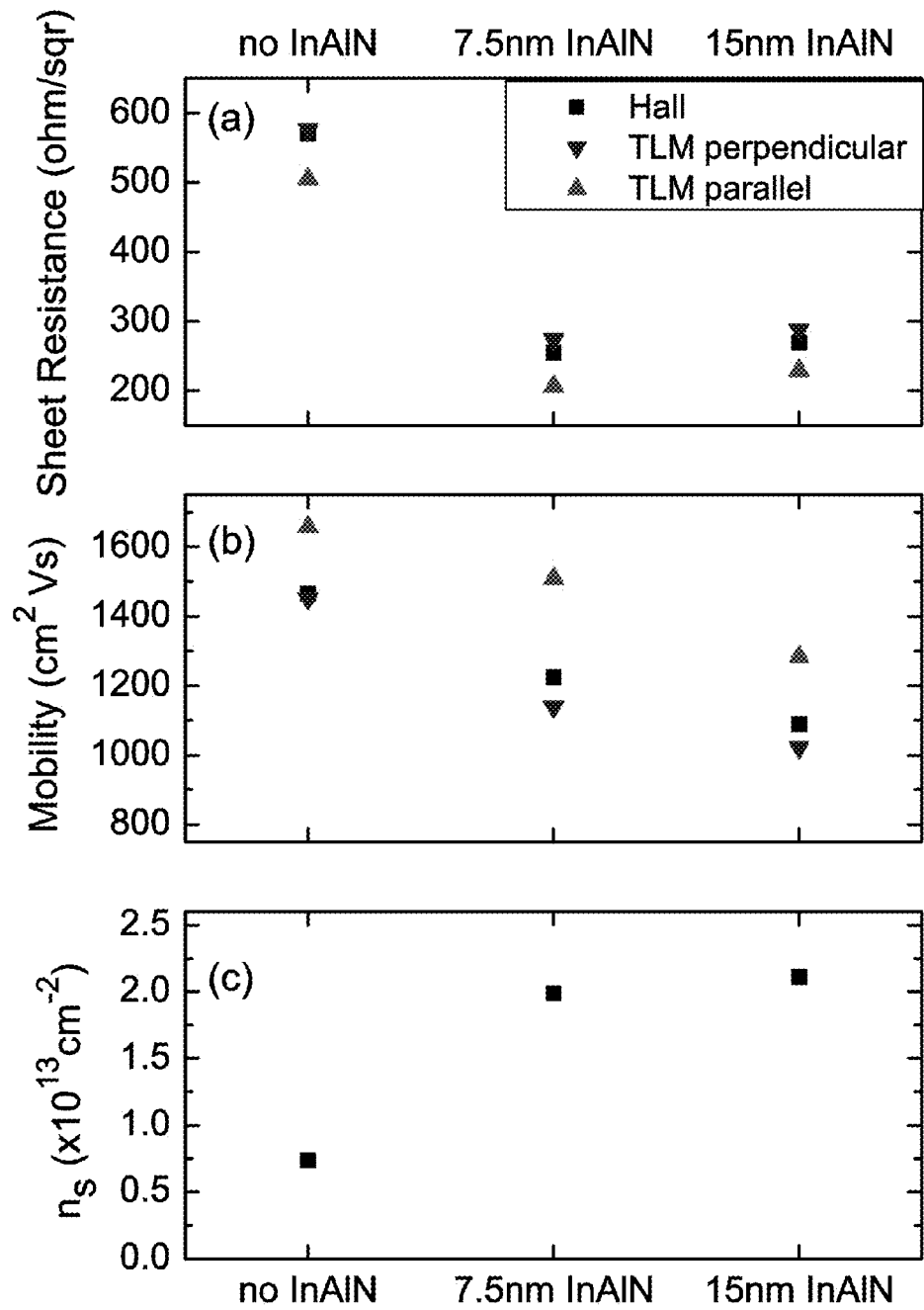
FIGS. 4(a), 4(b) and 4(c) include graphs showing.

FIGS. 4(a), 4(b) and 4(c) are graphs showing the electron concentration (FIG. 4(c)), directional dependent mobility (FIG. 4(b)), and sheet resistance (FIG. 4(a)) values, calculated from van der Pauw Hall measurements and transmission line measurements (TLM) of N-polar AlGaN/InAlN/AlN HEMTs having the structure of FIG. 2(a) with different thicknesses of the InAlN barrier layer. In these graphs, parallel refers to the direction parallel to the direction of current flow through the device, and perpendicular refers to the direction perpendicular to the direction of current flow through the device. For a conventional (i.e., no InAlN backbarrier) N-polar AlGaN HEMT with a 30 nm graded $Al_{0.35}Ga_{0.65}N$ backbarrier, the mobility was as high as 1657 $cm^2/Vs$ in the parallel direction; however, the charge was only $7.4 \times 10^{12}$ $cm^{-2}$, resulting in a sheet resistance of 505 Ω/sqr. By combining a 7.5 nm thick InAlN layer, the 2DEG charge increased to $2 \times 10^{13}$ $cm^{-2}$; meanwhile, the mobility was still as high as 1511 $cm^2/Vs$ in the parallel direction. The sheet resistance was significantly reduced from 505 to 207 Ω/sqr. When the thickness of the InAlN backbarrier layer was increased to 15 nm, the charge rose to $2.11 \times 10^{13}/cm^2$, with a parallel mobility, $\mu_{//}$, of 1286 $cm^2/Vs$, which gave a sheet resistance of 229 Ω/sqr.

Figure 5:
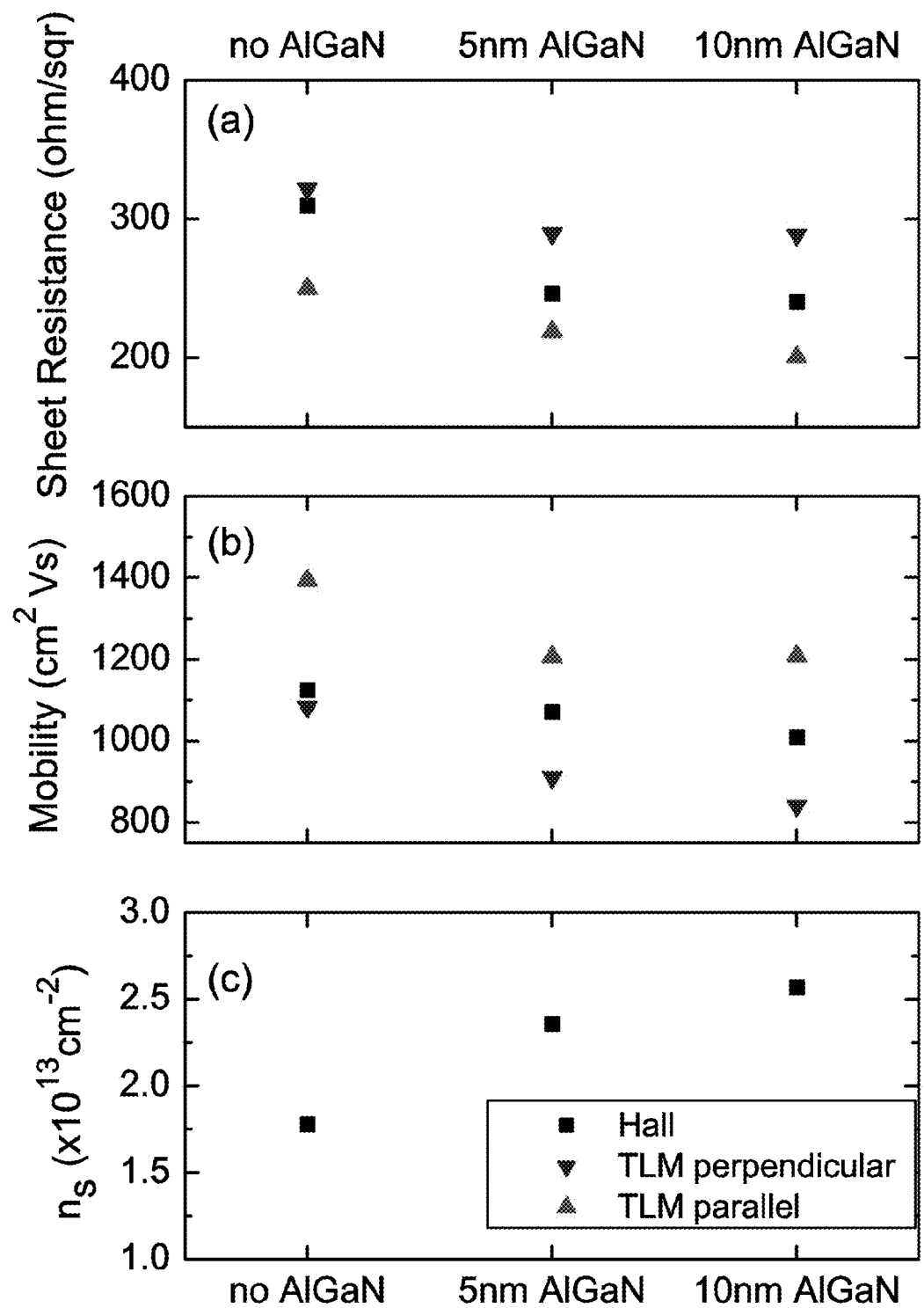
FIGS. 5(a), 5(b) and 5(c) include graphs showing.

FIGS. 5(a), 5(b) and 5(c) are graphs showing the electron concentration (FIG. 5(c)), directional dependent mobility (FIG. 5(b)) and sheet resistance (FIG. 5(a)) values, calculated from van der Pauw Hall and TLM measurements of N-polar AlGaN/InAlN/AlN HEMTs having the structure of FIG. 2(a) with different thicknesses of the AlGaN barrier layer. By adding a 5 nm or 10 nm $Al_{0.35}Ga_{0.65}N$ interlayer to the N-polar $In_{0.82}Al_{0.82}N$/GaN HEMT with a 10 nm InAlN backbarrier, $n_s$ increased from $1.78 \times 10^{13}$ $cm^{-2}$ to $2.36 \times 10^{13}$ $cm^{-2}$ and $2.57 \times 10^{13}$ $cm^{-2}$, respectively, with $\mu_{//}$ as high as 1209 $cm^2/Vs$. The lowest sheet resistance, 201 Ω/sqr was achieved for a 10 nm channel N-polar HEMT.

Figure 6:
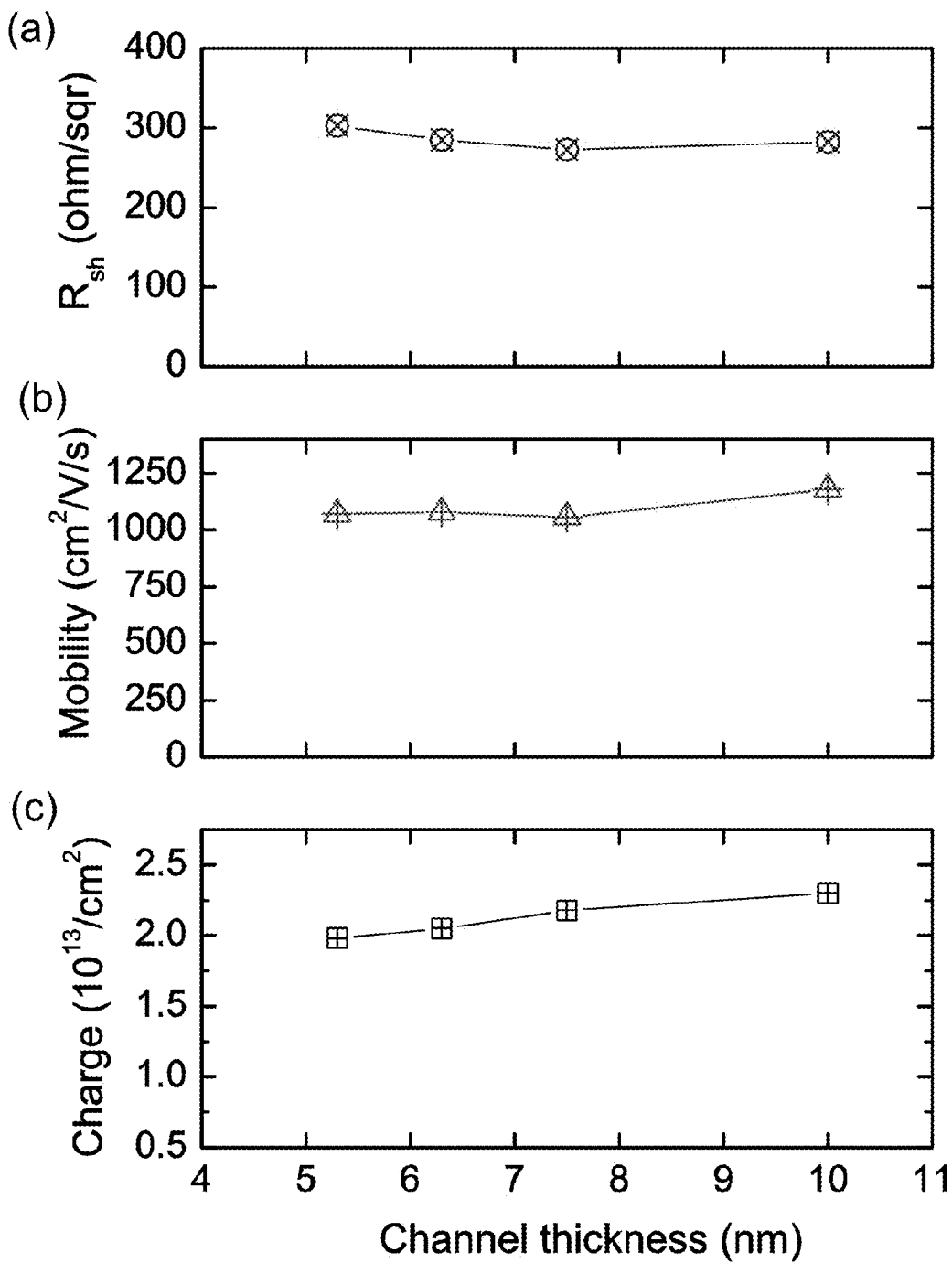
FIGS. 6(a), 6(b) and 6(c) include graphs showing.

FIGS. 6(a), 6(b) and 6(c) are graphs showing the electron concentration (FIG. 6(c)), mobility (FIG. 6(b)) and sheet resistance (FIG. 6(a)), dependent on the channel thickness of N-polar AlGaN/InAlN/AlN HEMTs having the structure of FIG. 2(a). The novel backbarrier design enables the fabrication of devices with channel thicknesses as low as 5 nm, while maintaining low sheet resistances of about 300 Ω/sqr and high electron mobility of about 1100 $cm^2$/Vs. As these measurements do not take the anisotropic transport under consideration, even lower sheet resistances are expected in actual devices oriented parallel to the surface steps.

Another advantage and improvement of the present invention is the breakdown voltage enhancement and gate leakage reduction by introducing a thin InAlN cap. FIGS. 7(a) and 7(b) illustrate epitaxial structures of an N-polar InAlN HEMT with a 2 nm thick InAlN cap 112 and 3 nm thick $SiN_x$ cap 114 on top, as shown in FIG. 7(b), in comparison with a structure having a 5 nm thick $SiN_x$ cap 114, as shown in FIG. 7(a). In both FIGS. 7(a) and 7(b), the epitaxial structures include a miscut sapphire substrate 100, a SI GaN template 102, a 7.5 nm thick n++ GaN layer 104 doped to a dopant concentration of $1.5 \times 10^{19}$ $cm^{-3}$, a 25 nm thick InAlN backbarrier 106a with an In composition of 17.5%, a 0.7 nm thick AN layer 108, and a GaN channel layer 110 having a thickness of x=15 nm or x=20 nm.

Van der Pauw Hall measurements showed that the 2 nm InAlN cap layer 112 slightly increased the sheet resistance due to a slight decrease in the 2DEG charge density from $2.34 \times 10^{13}$/$cm^2$ to $2.09 \times 10^{13}$/$cm^2$ caused by the negative polarization charge induced by InAlN cap layer, as shown in Table I:

TABLE I

Sheet resistance, electron concentration and mobility obtained by van der Pauw Hall measurements for samples with and without InAlN cap layer.

| Parameters | $t_{ch}$ = 20 nm | | $t_{ch}$ = 15 nm | |
| --- | --- | --- | --- | --- |
| | $SiN_x$ cap | w/InAlN | $SiN_x$ cap | w/InAlN |
| $R_{sh}$ (Ω/sqr) | 266 | 282 | 266 | 292 |
| ns ($10^{13}$/$cm^2$) | 2.34 | 2.09 | 2.34 | 2.09 |
| μ ($cm^2$/Vs) | 1002 | 1060 | 997 | 1019 |

No mobility degradation was observed.

Figure 8:
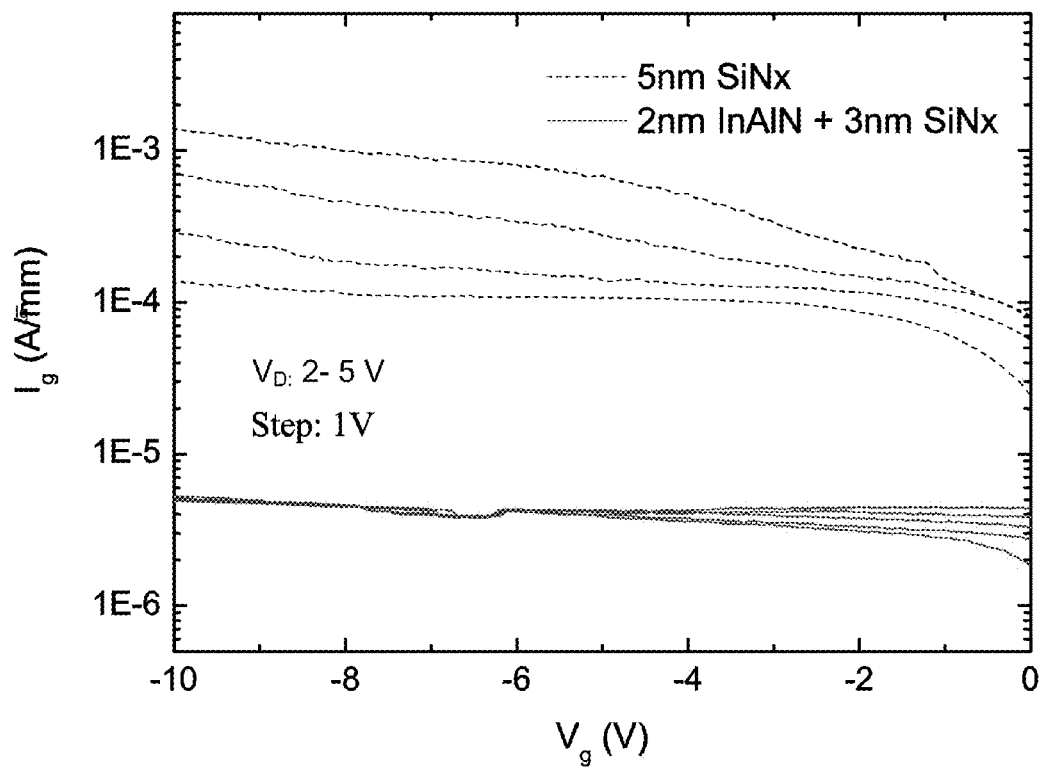
FIG. 8 is a graph comparing gate leakage $I_g$ of the devices having the structures in FIGS. 7(a) and 7(b), at different bias conditions $V_g$ applied to the gate (channel thickness $t_{ch}$=15 nm), wherein the Voltage applied to the Drain $V_D$ (with respect to the grounded source) is stepped from 2 to 5 Volts in 1 Volt increments.
Figure 9:
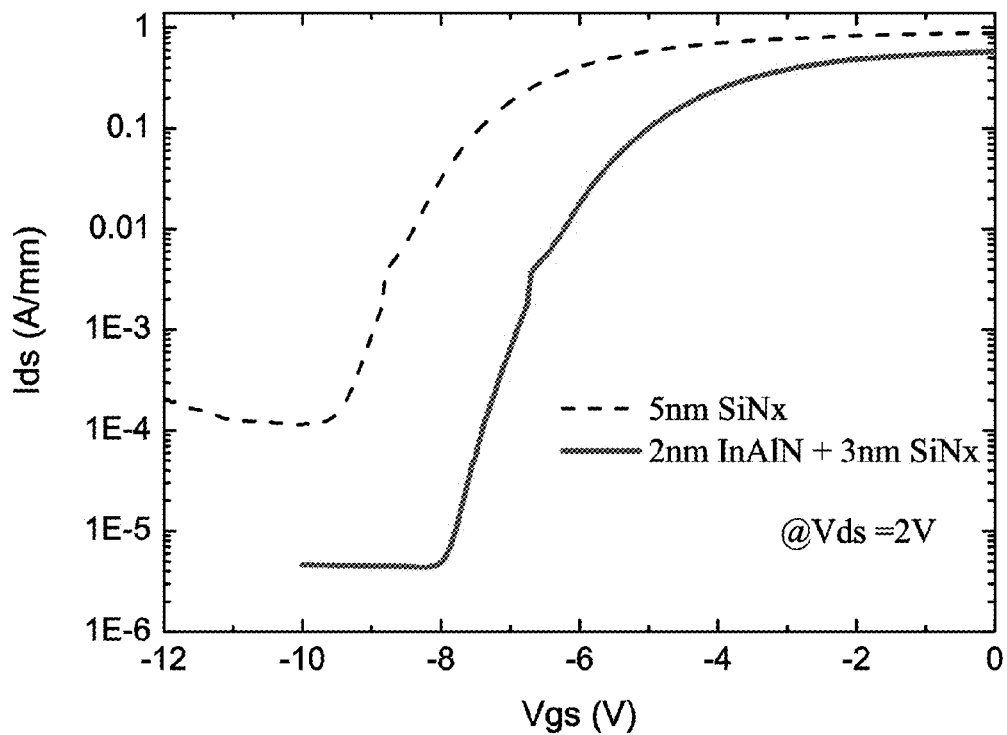
FIG. 9 is a graph comparing pinch off voltage, on current/off current ($I_{on}/I_{off}$) ratio and subthreshold swing ($t_{ch}$=15 nm), for devices having the structures in FIGS. 7(a) and 7(b), plotting the drain source current $I_{ds}$ as a function of gate source voltage $V_{gs}$.

FIG. 8 shows the comparison of gate leakage at different bias conditions. The inserted 2 nm InAlN cap layer effectively reduced the gate leakage by around 2-orders of magnitude. The $I_{on}$/$I_{off}$ ratio was enhanced by 2 orders of magnitude, as shown in FIG. 9. The subthreshold swing was decreased from about 1.15 V/decade to around 0.45V/decade.

Figure 10:
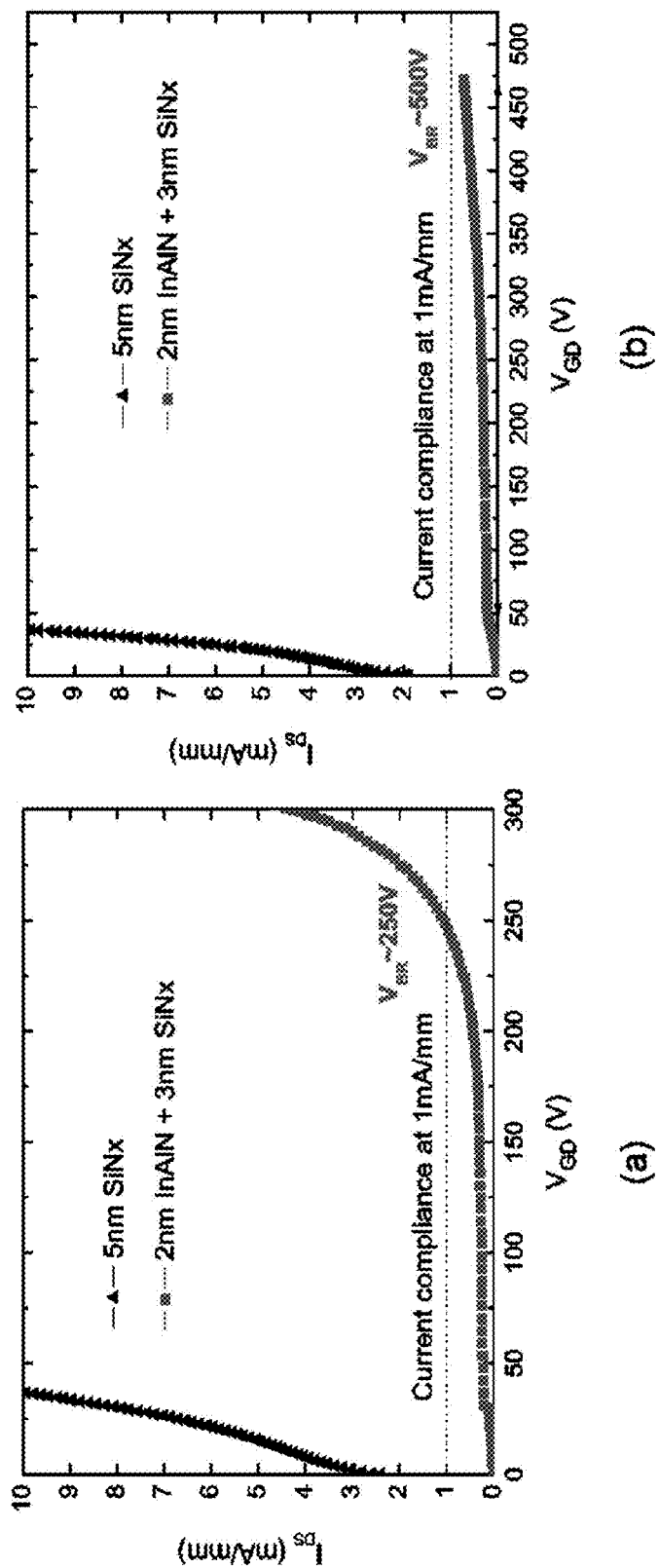

FIGS. 10(a) and 10(b) show the comparison of the three-terminal breakdown voltage, defined as the voltage required for a leakage current of 1 mA/mm, which indicates that the 2 nm InAlN cap layer 112 significantly improved the breakdown voltage. Breakdown voltages as high as 250 V, as shown in FIG. 10(a), for devices with 2 μm gate to drain spacing $L_{gd}$ and 500 V, as shown in FIG. 10(b), for devices with 5 μm gate to drain spacing were achieved.

Figure 11:
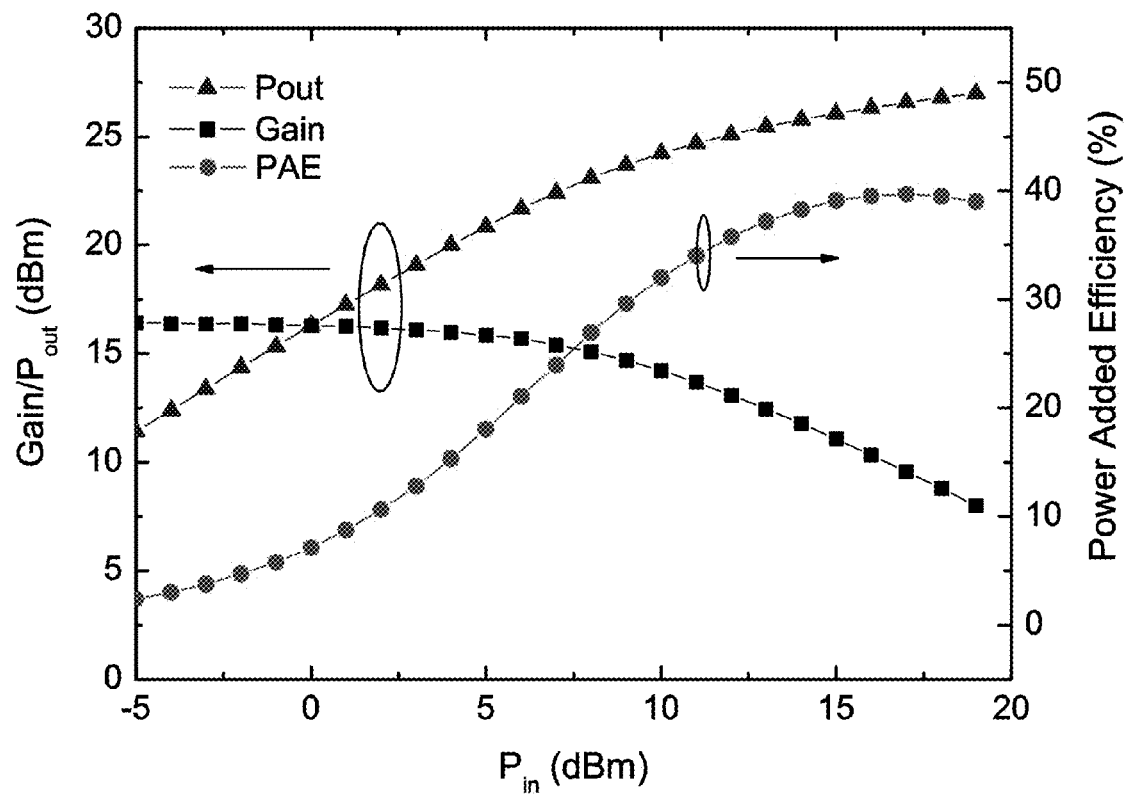
FIG. 11 is a graph showing large-signal performance at 4 GHz of the device having the structure of FIG. 7(b) with a 2 nm InAlN and 3 nm $SiN_x$ combination cap with 20 nm channel thickness, plotting gain and output power $P_{out}$ in decibel milliwatt (dBm) and power added efficiency (%) as a function of input power $P_{in}$.

Power measurements were performed using a Maury microwave load-pull system. An output power density of 3.34 W/mm with an associated power added efficiency (PAE) of 39% was obtained at a drain bias of 18 V at 4 GHz, as shown in FIG. 11. Higher output power is expected by using SiC substrates to reduce self-heating as well as by using improved gate and passivation technology.

Process Steps

Figure 12:
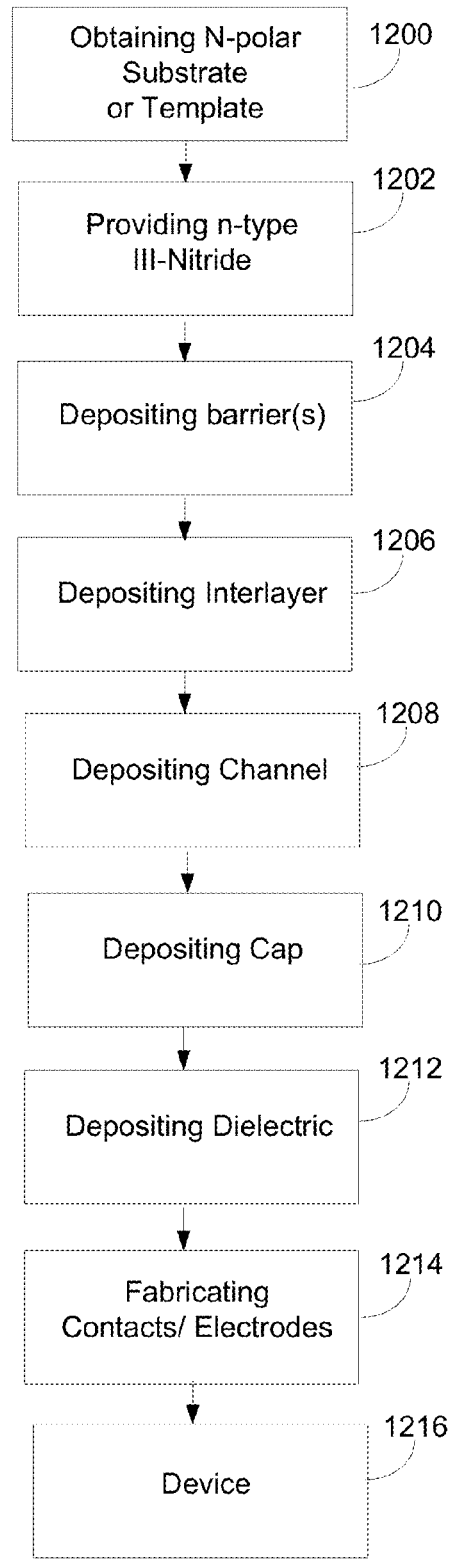
FIG. 12 is a flowchart illustrating a method of fabricating a HEMT.

FIG. 12 illustrates a method of fabricating an electronic device, such as a Nitrogen polar (N-polar) or Nitrogen N-face (N-face) III-Nitride high electron mobility transistor (HEMT). The layers in Blocks 1202-1210, or the barrier layer of Block 1204 and the channel layer of Block 1208, can be grown using metal organic chemical vapor deposition (MOCVD).

Block 1200 represents obtaining an N-polar or N-face III-nitride substrate (e.g., GaN), or N-polar or N-face III-nitride template (e.g., GaN) on a substrate. The substrate or template can be semi insulating or n-type doped, for example. In one example, the substrate is a miscut sapphire substrate having a growth surface miscut by 4 degrees towards the sapphire a-plane, and such that III-nitride layers deposited on the growth surface are N-polar or N-face. However, other miscuts or other techniques for obtaining N-face or N-polar III-nitride layers are included. Accordingly, the step includes depositing an N-face or N-polar III-nitride template layer (e.g., heteroepitaxially) on any substrate (such as sapphire or silicon carbide) that allows for growth of N-face or N-polar III-nitride layers. The subsequent HEMT layers can be grown on a [0 0 0 –1] or N-face surface of the III-nitride template or substrate.

Block 1202 represents, in the case where the substrate or template is semi-insulating, depositing or providing an n-type GaN or III-nitride layer on the template or substrate.

Block 1204 represents depositing or forming a Nitrogen polar $In_xAl_yGa_zN$ barrier layer on the n-type GaN or III-nitride layer on or above the substrate or the template. An indium composition x of the barrier layer can be between 0.15 and 0.2. The indium composition can be varied from 0 to 17.5% or even higher depending on the application and strain limit.

A composition, thickness, and structure of the barrier layer can be such that for a channel thickness (formed in Block 1208) of no more than 5 nm, the a sheet resistance of the 2DEG is less than 300Ω per square and an electron mobility of the 2DEG is no less than 1100 $cm^2$/Vs.

The barrier layer can be substantially lattice matched to GaN or to the III-nitride substrate or template.

The barrier layer can be doped.

The $In_xAl_yGa_zN$ barrier layer can be part of a backbarrier, the backbarrier further comprising an AlGaN barrier layer. The AlGaN barrier layer can be between the $In_xAl_yGa_zN$ barrier layer and the template or substrate. The $In_xAl_yGa_zN$ barrier layer can be between the AlGaN barrier layer and the template or substrate.

Block 1206 represents depositing an (e.g. AlN) interlayer on the backbarriers or barrier layer.

Block 1208 represents depositing a channel layer (e.g., GaN or III-nitride channel layer) on the AlN interlayer.

Block 1210 represents depositing an (e.g.) InAlN cap layer above the channel layer such that the channel layer is between the InAlN cap layer and the barrier layer.

A composition and thickness of the InAlN cap layer can be such that a breakdown voltage of the device is no less than 125 Volts per 1 micrometer of gate to drain distance $L_{gd}$.

A composition and thickness of the InAlN cap and the barrier layer can be such that the HEMT has an output power density of at least 3.34 W/mm with an associated power added efficiency (PAE) of at least 39% at a drain bias of 18 V and at an operation frequency of 4 GHz.

Block 1212 represents depositing a dielectric layer on the cap layer.

Block 1214 represents forming an electrode over the channel layer, wherein an N-face of the channel layer is adjacent to the electrode and a Group III face of the channel layer is opposite the N-face. The electrode is a gate, and the step can further comprise forming a source and drain on opposite sides of the gate.

Figure 13:
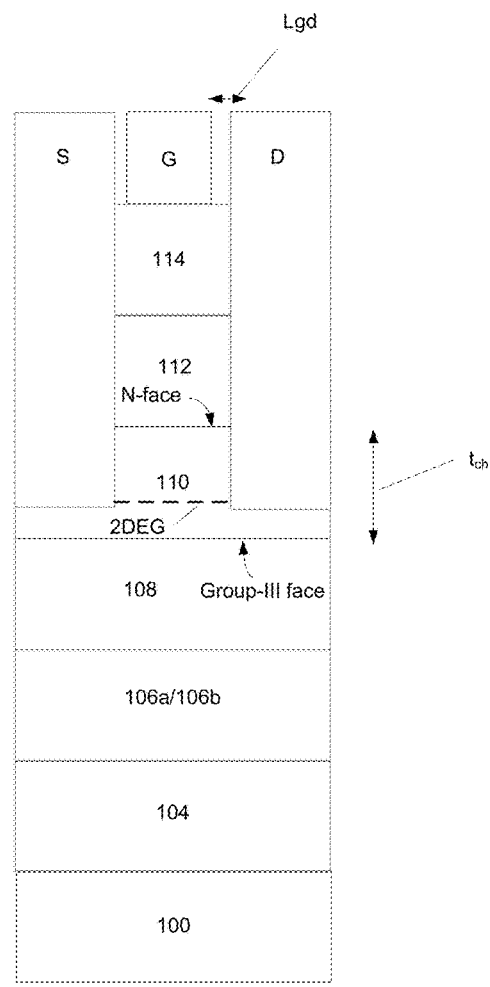
FIG. 13 is a cross-sectional schematic of a HEMT.

Block 1216 represents the end result, an electronic device such as a HEMT illustrated in FIG. 13, comprising a Nitrogen polar III-Nitride channel layer 110 on or above a Nitrogen polar $In_xAl_yGa_zN$ barrier layer 106a/106b, wherein a compositional difference between the barrier layer 106a/106b and the channel layer results in a two-dimensional electron gas (2DEG) being induced in the channel layer 110; and an electrode (gate G) over the channel layer 110, wherein an N-face of the channel layer 110 is adjacent to the electrode G and a Group III face of the channel layer 110 is opposite the N-face, and wherein an indium composition x of the barrier layer 106a/b is between 0.15 and 0.2.

Also shown are a source S and drain D on opposite sides of the gate G (e.g., the source and drain making ohmic contact to the 2DEG), channel thickness $t_{ch}$, and gate to drain distance $L_{gd}$.

FIG. 12 also illustrates a method for (e.g., heteroepitaxial) growth of high channel conductivity Nitrogen polar (N-polar) HEMT with (In,Al,Ga)N combination backbarriers and an approach to increase breakdown voltage and reduce gate leakage of N-polar (In, Al, Ga)N HEMTs, wherein the backbarriers and/or InAlN cap layer can be selected to achieve the high channel conductivity, increased breakdown voltage, and reduced gate leakage.

REFERENCES

The following references are incorporated by reference herein:

[1] J. Kuzmik, "Power Electronics on InAlN/(In)GaN: Prospect for a Record Performance," IEEE Electron Device Letters, Vol. 22, No. 11, 2001, pp. 510-512.

[2] S. Keller et al., "Influence of the substrate misorientation on the properties of N-polar InGaN/GaN and AlGaN/GaN heterostructures," Journal of Applied Physics 104, 093510 (2008), pp. 093510-1 to 093510-6.

[3] M. H. Wong et al., "Low nonalloyed Ohmic contact resistance to nitride high electron mobility transistors using N-face growth," Applied Physics Letters 91, 232103 (2007), pp. 232103-1 to 232103-3.

[4] S. Rajan, Ph.D. thesis, "Advanced Polarization Engineering for GaN-based Transistors," University of California, Santa Barbara, December 2006.

[5] D. Brown et al., "Growth and characterization of In-polar and N-polar InAlN by metal organic chemical vapor deposition," Journal of Applied Physics 107, 033509 (2010, pp. 033509-1 to 033509-7.

[6] S. Kolluri et al., "RF Performance of N-Polar AlGaN/GaN MIS-HEMTs Grown by MOCVD on Sapphire Substrate," IEEE Electron Device Letters, Vol. 30, No. 6, June 2009, pp. 584-586.

[7] U.S. Pat. No. 7,935,985, issued May 3, 2011, to Mishra et al., and entitled "N-Face High Electron Mobility Transistors with Low Buffer Leakage and Low Parasitic Resistance."

[8] U.S. Pat. No. 7,948,011, issued May 24, 2011, to Rajan et al., and entitled "N-polar aluminum gallium nitride/gallium nitride enhancement-mode field effect transistor."

[9] U.S. Pat. No. 7,566,580, issued Jul. 28, 2009, to Keller et al., and entitled "Method for heteroepitaxial growth of high-quality N-face GaN, InN, and AlN and their alloys by metal organic chemical vapor deposition."

[10] "Very-high channel conductivity in N-face (InAlN,AlGaN)/GaN high electron mobility hetero junctions grown by metalorganic chemical vapor deposition", Jing Lu, Matthew Laurent, Roy Chung, Shalini Lal, Alex Sztein, Stacia Keller, Steven P. DenBaars, Umesh K. Mishra, abstract of presentation presented at the Electronic Materials Conference (EMC) on Jun. 20, 2012.

[11] "Influence of a thin InAlN cap layer on the device performance of N-polar InAlN/GaN MIS-HEMTs grown by MOCVD", Jing Lu, Dan Denninghoff, Matthew Laurent, Geetak Gupta, Stacia Keller, Steven P. DenBaars, Umesh K. Mishra, abstract of presentation presented at the International Symposium on Compound Semiconductors (ISCS) on Aug. 27, 2012.

[12] "Ultra Thin Channel N-polar (InAlN, AlGaN)/GaN HEMTs Grown by Metal Organic Chemical Vapor Deposition", Jing Lu, Dan Denninghoff, Stacia Keller, Steven P. DenBaars and Umesh K. Mishra, abstract of presentation given at the International Workshop on Nitride Semiconductors (IWN) on Oct. 18, 2012.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating an electronic device, comprising:
   forming a Nitrogen polar III-Nitride channel layer on a Nitrogen polar $In_xAl_yGa_zN$ barrier layer, wherein a compositional difference between the barrier layer and the channel layer results in a two-dimensional electron gas (2DEG) being induced in the channel layer; and
   forming an electrode over the channel layer, wherein an N-face of the channel layer is adjacent to the electrode and a Group III face of the channel layer is opposite the N-face;
   wherein an indium composition x of the barrier layer is between 0.15 and 0.2.

2. The method of claim 1, further comprising forming the Nitrogen polar $In_xAl_yGa_zN$ barrier layer on or above a substrate or a template on the substrate.

3. The method of claim 2, wherein a composition, thickness, and structure of the barrier layer is such that for a channel thickness of no more than 5 nm, the a sheet resistance of the 2DEG is less than 300Ω per square and an electron mobility of the 2DEG is no less than 1100 cm$^2$/Vs.

4. The method of claim 2, wherein the barrier layer is substantially lattice matched to GaN or to the III-nitride substrate or template.

5. The method of claim 4, wherein the barrier layer is doped.

6. The method of claim 2, wherein the $In_xAl_yGa_zN$ barrier layer is part of a backbarrier, the backbarrier further comprising an AlGaN barrier layer.

7. The method of claim 6, wherein the AlGaN barrier layer is between the $In_xAl_yGa_zN$ barrier layer and the template or substrate.

8. The method of claim 6, wherein the $In_xAl_yGa_zN$ barrier layer is between the AlGaN barrier layer and the template or substrate.

9. The method of claim 2, further comprising:
depositing an InAlN cap layer above the channel layer such that the channel layer is between the InAlN cap layer and the barrier layer.

10. The method of claim 9, wherein the electrode is a gate, and the device further comprises a source and drain on opposite sides of the gate, wherein a composition and thickness of the InAlN cap layer is such that a breakdown voltage of the device is no less than 125 Volts per 1 micrometer of gate to drain distance $L_{gd}$.

11. The method of claim 1, wherein the barrier layer and the channel layer are grown using metal organic chemical vapor deposition (MOCVD).

12. An electronic device, comprising:
a Nitrogen polar III-Nitride channel layer on a Nitrogen polar $In_xAl_yGa_zN$ barrier layer, wherein a compositional difference between the barrier layer and the channel layer results in a two-dimensional electron gas (2DEG) being induced in the channel layer; and
an electrode over the channel layer, wherein an N-face of the channel layer is adjacent to the electrode and a Group III face of the channel layer is opposite the N-face;
wherein an indium composition x of the barrier layer is between 0.15 and 0.2.

13. The device of claim 12, wherein the barrier layer is on or above a substrate or a template on the substrate.

14. The device of claim 13, wherein a composition, thickness, and structure of the barrier layer is such that for a channel layer thickness of no more than 5 nm, a sheet resistance of the 2DEG is less than 300Ω per square and an electron mobility of the 2DEG is no less than 1100 cm²/Vs.

15. The device of claim 13, wherein the barrier layer is substantially lattice matched to GaN or to the III-nitride substrate or template.

16. The device of claim 13, wherein the $In_xAl_yGa_zN$ barrier layer is part of a backbarrier, the backbarrier further comprising an AlGaN barrier layer.

17. The device of claim 16, wherein the AlGaN barrier layer is between the $In_xAl_yGa_zN$ barrier layer and the template or substrate.

18. The device of claim 16, wherein the $In_xAl_yGa_zN$ barrier layer is between the AlGaN barrier layer and the template or substrate.

19. The device of claim 13, further comprising:
an InAlN cap layer above the channel layer such that the channel layer is between the InAlN cap layer and the barrier layer.

20. The device of claim 19, wherein the electrode is a gate, the device further comprising a source and drain on opposite sides of the gate, wherein a composition and thickness of the InAlN cap layer is such that a breakdown voltage of the device is no less than 125 Volts per 1 micrometer of gate to drain distance $L_{gd}$.

21. The device of claim 19, wherein a composition and thickness of the InAlN cap and the barrier layer is such that the device is a HEMT having an output power density of at least 3.34 W/mm with an associated power added efficiency (PAE) of at least 39% at a drain bias of 18 V and at an operation frequency of 4 GHz.

* * * * *